(12) United States Patent
Chang et al.

(10) Patent No.: US 12,376,323 B2
(45) Date of Patent: Jul. 29, 2025

(54) SEMICONDUCTOR STRUCTURE AND THE FORMING METHOD THEREOF

(71) Applicant: UNITED MICROELECTRONICS CORP., Hsin-Chu (TW)

(72) Inventors: Chih-Wei Chang, Tainan (TW); Da-Jun Lin, Kaohsiung (TW); Yao-Hsien Chung, Kaohsiung (TW); Shih-Wei Su, Tainan (TW); Hao-Hsuan Chang, Kaohsiung (TW); Ting-An Chien, Tainan (TW); Bin-Siang Tsai, Changhua County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 544 days.

(21) Appl. No.: 17/834,936

(22) Filed: Jun. 8, 2022

(65) Prior Publication Data

US 2023/0163207 A1    May 25, 2023

(30) Foreign Application Priority Data

Nov. 23, 2021    (CN) .......................... 202111391398.2

(51) Int. Cl.
*H10D 30/47*      (2025.01)
*H10D 30/01*      (2025.01)
*H10D 62/85*      (2025.01)

(52) U.S. Cl.
CPC ......... *H10D 30/475* (2025.01); *H10D 30/015* (2025.01); *H10D 62/8503* (2025.01)

(58) Field of Classification Search
CPC .............. H10D 30/475; H10D 30/015; H10D 62/8503; H10D 62/82; H10D 62/834; H10D 62/343; H10D 30/4755
See application file for complete search history.

(56) References Cited

U.S. PATENT DOCUMENTS

| | | | |
|---|---|---|---|
| 9,634,107 B2 | 4/2017 | De Jaeger | |
| 10,068,976 B2 | 9/2018 | Yeh | |
| 10,680,094 B2 | 6/2020 | Banerjee | |
| 10,985,271 B2 | 4/2021 | Yang | |
| 11,081,579 B2 | 8/2021 | Chang | |
| 11,239,327 B2 | 2/2022 | Lee | |
| 11,264,492 B2* | 3/2022 | Huang | H10D 62/8503 |
| 11,296,214 B2 | 4/2022 | Lee | |
| 2009/0121775 A1* | 5/2009 | Ueda | H10D 30/475 257/E29.093 |
| 2013/0256699 A1* | 10/2013 | Vielemeyer | H10D 30/47 257/77 |
| 2020/0044067 A1* | 2/2020 | Banerjee | H10D 30/015 |
| 2020/0328298 A1* | 10/2020 | Yang | H10D 64/513 |

* cited by examiner

*Primary Examiner* — Marlon T Fletcher
*Assistant Examiner* — Samuel Jonathan Smith
(74) *Attorney, Agent, or Firm* — Winston Hsu

(57) ABSTRACT

The invention provides a semiconductor structure, which comprises a GaN gallium nitride (GaN) layer, an aluminum gallium nitride (AlGaN) layer on the gallium nitride layer, a polarization boost layer on and in direct contact with the aluminum gallium nitride layer, and a gate liner layer on the polarization boost layer.

9 Claims, 3 Drawing Sheets

SEMICONDUCTOR STRUCTURE AND THE FORMING METHOD THEREOF

BACKGROUND OF THE INVENTION

1. Field of the Invention

The invention relates to an insulating structure of a transistor with high electron mobility and a manufacturing method thereof, which is characterized by comprising a polarization boost layer which can improve the polarity of an AlGaN layer.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity. A two-dimensional electron gas (2DEG) may be generated by the piezoelectricity property of the GaN-based materials, and the switching velocity may be enhanced because of the higher electron velocity and the higher electron density of the 2DEG.

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

The invention provides a semiconductor structure, which comprises a gallium nitride (GaN) layer, an aluminum gallium nitride (AlGaN) layer on the gallium nitride layer, a polarization boost layer on the aluminum gallium nitride layer and in direct contact with the aluminum gallium nitride layer, and a gate liner layer on the polarization boost layer.

The invention provides a manufacturing method of a semiconductor structure, which comprises forming a gallium nitride (GaN) layer, forming an aluminum gallium nitride (AlGaN) layer on the gallium nitride layer, forming a polarization boost layer on the aluminum gallium nitride layer and directly contacting the aluminum gallium nitride layer, and forming a gate liner layer on the polarization boost layer.

According to the invention, the polarization boost layer is arranged on the AlGaN layer, wherein the polarization boost layer is p-type doped silicon, so that the polarity of the AlGaN layer can be improved. In addition, the polarity of the 2DEG layer is also increased, and the efficiency of the transistor is further improved. Besides, a part of the polarization boost layer has become a polarization modification layer in the manufacturing process, which has the effects of reducing surface roughness and preventing ion diffusion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic diagrams of a method for manufacturing an insulating structure of a high electron mobility transistor according to a first preferred embodiment of the present invention, in which:

FIG. 2 is a schematic diagram of steps subsequent to FIG. 1;

FIG. 3 is a schematic diagram of steps subsequent to FIG. 2;

FIG. 4 is a schematic diagram of steps subsequent to FIG. 3;

FIG. 5 is a schematic diagram of steps subsequent to FIG. 4; and

FIG. 6 is a schematic diagram of steps subsequent to FIG. 5.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the Figures are only for illustration and the Figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
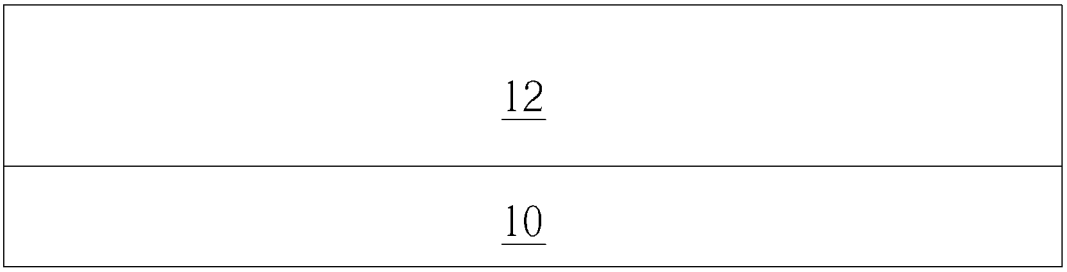
Figure 2:
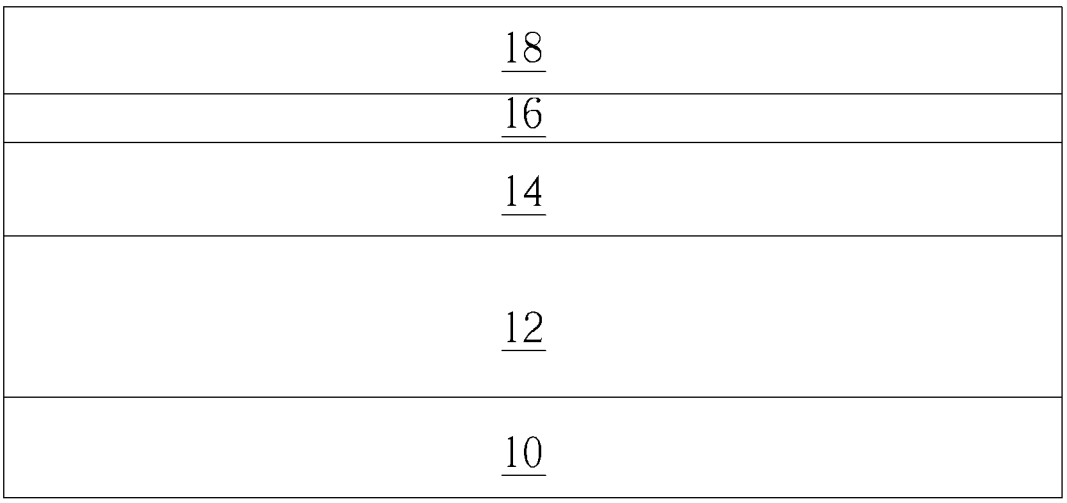
Figure 3:
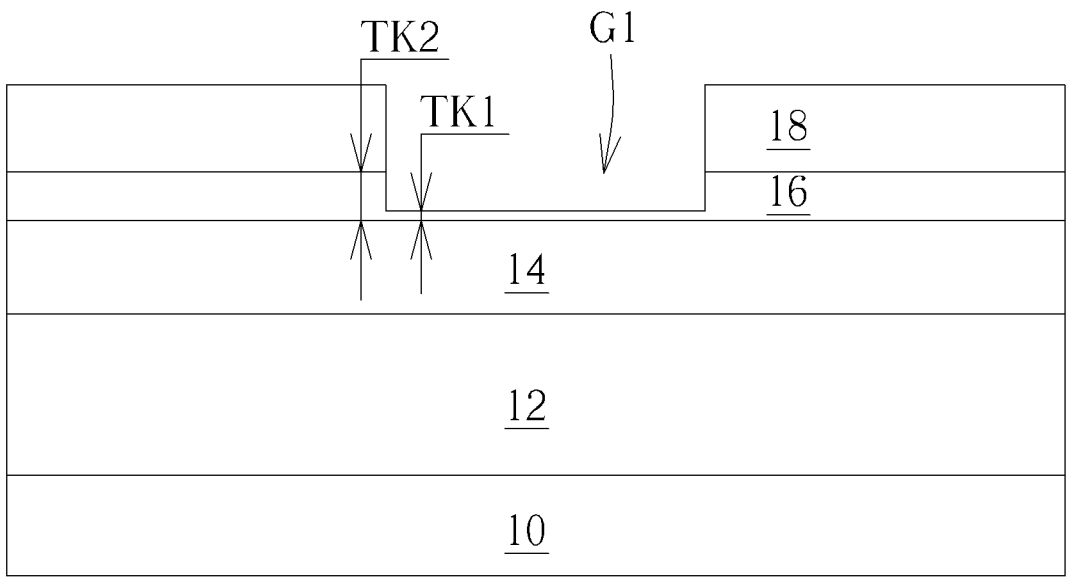
Figure 4:
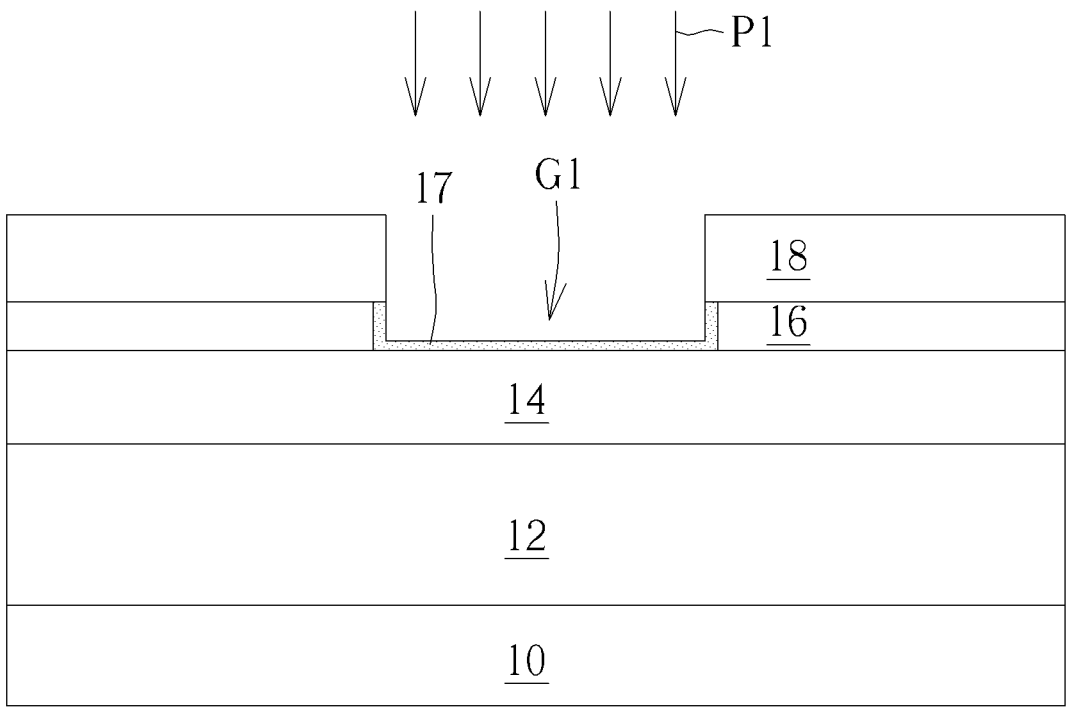
Figure 5:
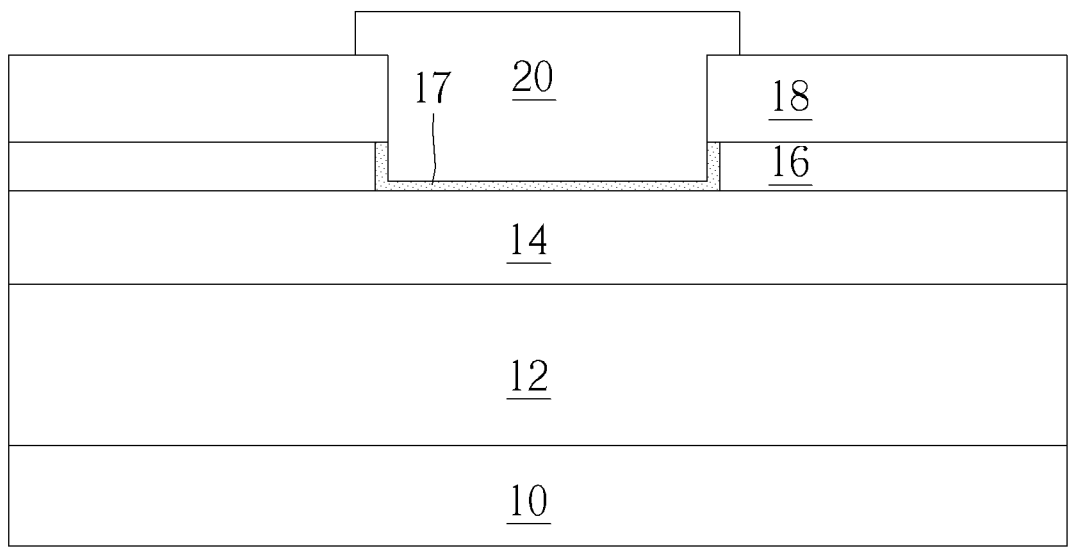
Figure 6:
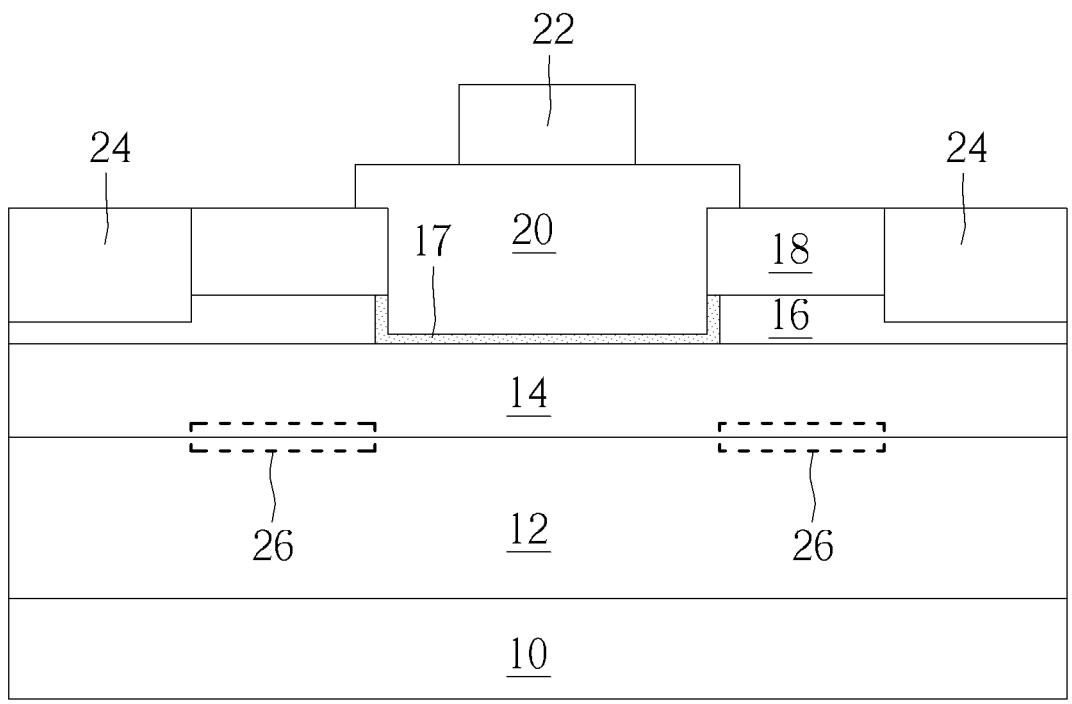

Please refer to FIG. 1 to FIG. 6, which are schematic diagrams of the method of manufacturing the insulation structure of a high electron mobility transistor according to the first preferred embodiment of the present invention. FIG. 2 is a schematic diagram of steps after FIG. 1; FIG. 3 is a schematic diagram of steps subsequent to FIG. 2; FIG. 4 is a schematic diagram of steps subsequent to FIG. 3; FIG. 5 is a schematic diagram of steps subsequent to FIG. 4; and FIG. 6 is a schematic diagram of steps subsequent to FIG. 5. As shown in FIG. 1, firstly, a substrate 10, such as a substrate made of silicon, silicon carbide or alumina (or sapphire) is provided, the substrate 10 can be a single-layer substrate, a multi-layer substrate, a gradient substrate or a combination thereof. Accord to other embodiments of that present invention, the substrate 10 may further comprise a silicon-on-insulator (SOI) substrate.

Then a gallium nitride (GaN) layer 12 is formed on the surface of the substrate 10. In an embodiment, molecular-beam epitaxy (MBE), metal organic chemical vapor deposition (MOCVD), chemical vapor deposition (CVD) process, hydride vapor phase epitaxy (HVPE) process, or a combination thereof, to form the gallium nitride layer 12 on the substrate 10. In addition, in some embodiments, a buffer layer (not shown) can be additionally formed between the substrate 10 and the gallium nitride layer 12. The buffer layer can help the gallium nitride layer 12 to be formed on the substrate 10. The material of the buffer layer may be aluminum nitride (AlN), but it is not limited to this.

As shown in FIG. 2, an aluminum gallium nitride (AlGaN) layer 14 is then formed on the surface of the gallium nitride layer 12. The aluminum gallium nitride layer 14 preferably comprises an epitaxial layer formed by an epitaxial growth process. As the above-mentioned method of forming the gallium nitride layer 12, molecular-beam epitaxy (MBE), metal organic chemical vapor deposition (MOCVD), chemical vapor deposition (CVD) process, hydride vapor phase epitaxy (HVPE) process, or a combination thereof, to form the aluminum gallium nitride layer 14 on the gallium nitride layer 12.

It should be noted that after forming the AlGaN layer 14 on the surface of the gallium nitride layer 12, the interface between the gallium nitride layer 12 and the AlGaN layer 14 preferably forms a heterojunction because of the different band gap between the materials of the gallium nitride layer 12 and the AlGaN layer 14. The energy band at the heterojunction bends, and a quantum well is formed in the depth of the conduction band bend, which confines the electrons generated by piezoelectricity effect in the quantum well, so a channel region or two-dimensional electron gas (2DEG) layer is formed at the interface between the gallium nitride layer 12 and the aluminum gallium nitride layer 14, and then on current is formed.

Next, still referring to FIG. 2, a polarization boost layer 16 is formed on the aluminum gallium nitride layer 14, and a dielectric layer 18 is formed on the polarization boost layer 16. The material of the polarization boost layer 16 in this embodiment is a p-type doped silicon layer, for example, boron, aluminum, gallium, indium and thallium ions are doped, but not limited to this. The dielectric layer 18 is made of insulating materials such as silicon oxide and silicon nitride. This embodiment is characterized in that the polarization boost layer 16 is arranged on the aluminum gallium nitride layer 14. Because the polarization boost layer 16 is a p-type doped silicon layer, it can attract the negative charges in the lower aluminum gallium nitride layer 14 (attract the negative charges in the aluminum gallium nitride layer 14 upwards), and at the same time, make the positive charges in the aluminum gallium nitride layer 14 more concentrated in the lower part, which will increase the polarity of the 2DEG layer and further improve the quality and efficiency of the high electron mobility transistor.

Then, as shown in FIG. 3, for example, an etching step is performed to remove a part of the dielectric layer 18 and the polarization boost layer 16, and a groove G1 is formed in the dielectric layer 18 and the polarization boost layer 16. In which the position of the groove G1 is about the position where the gate liner is to be formed in the subsequent step. It should be noted that the etching step did not completely remove the polarization boost layer 16, in other words, a part of the polarization boost layer 16 remained at the bottom of the groove G1, but the thickness of the polarization boost layer 16 under the groove G1 is thinner than that of other regions. In other words, the thickness of the polarization boost layer 16 under the groove G1 is defined as TK1, and the thickness of other polarization boost layers 16 not located under the groove G1 is defined as TK2, where 0<TK1<TK2. In addition, TK2 is preferably less than 30 angstroms, but not limited thereto.

Next, the 2DEG layer should be cut off at the place where the gate structure is scheduled to be formed, so that it will be normally off, and the 2DEG layer will be connected when the gate supplies voltage, so as to achieve the switching function of the transistor. In order to achieve the above purpose, as shown in FIG. 4, a gate liner layer is formed in the groove G1 to cut off the 2DEG layer (the gate liner layer is for example p-type doped gallium nitride, which will be described later). Before the gate liner layer is formed, some pre-treatment steps P1 may be performed to the groove G1, such as annealing, plasma, doping, wet cleaning, etc., but not limited to this. These pre-treatment steps P1 may change the material of the polarization boost layer 16 exposed under the groove G1 to be different from other polarization boost layers 16. After the pre-treatment step P1, the polarization boost layer 16 at the bottom of the groove G1 will be completely converted, while the polarization boost layer 16 exposed at the sidewall of the groove G1 will be partially converted. Part of the polarization boost layer 16 below the groove G1 is defined as the polarization modification layer 17, the concentration of elements including but not limited to carbon, oxygen, nitrogen, fluorine and the like in the polarization modification layer 17 may be higher than that in the polarization boost layer 16.

Then, as shown in FIG. 5, a gate liner layer 20 is formed above the polarization modification layer 17 of the groove G1, the material of the gate liner layer 20 is, for example, p-type doped gallium nitride. The purpose of forming the gate liner layer 20 is to cut off a part of the 2DEG layer directly below, so that the whole high electron mobility transistor is in the normally off state. For example, the forming method of the gate liner layer 20 may include forming a gallium nitride layer in the groove G1, doping the gallium nitride layer, and removing the excess gallium nitride layer by a patterning step. It should be noted that in this embodiment, the width of the gate liner layer 20 is larger than the width of the groove G1, so a part of the gate liner layer 20 covers the dielectric layer 18, but the present invention is not limited to this.

It should be noted that the polarization modified layer 17 formed here has other advantages, including its relatively flat surface, which can reduce the surface roughness of the material layer and improve the quality of the gate liner layer (such as p-type doped gallium nitride) formed subsequently. In addition, since the gate liner layer 20 is doped with p-type ions (such as magnesium ions), sometimes these p-type doped ions will diffuse to other places, and the polarization modification layer 17 can prevent the diffusion of ions, thereby improving the quality of the device.

Finally, as shown in FIG. 6, the gate electrode 22 is formed on the gate liner layer 20, and the source/drain electrodes 24 are formed in the dielectric layer 18 and the polarization boost layer 16 on both sides of the gate electrode 22, respectively. It should be noted that there is a polarization boost layer 16 with full thickness between the gate electrode 22 and the source/drain electrode 24, and the polarity of the aluminum gallium nitride layer 14 directly under the polarization boost layer 16 with full thickness will be enhanced, thereby improving the conductivity of the lower 2DEG layer. Here, the position of the enhanced 2D electron gas (2DEG) layer 26 is defined. In this embodiment, the enhanced 2DEG layer 26 has better conductivity than the 2DEG layer formed at other places and at the interface between the gallium nitride layer 12 and the aluminum gallium nitride layer 14 (that is, without the polarization boost layer 16), so that the reaction speed of the transistor can be improved. In addition, a part of the polarization boost layer 16 remains under the source/drain electrode 24, and the thickness of the polarization boost layer 16 under the source/drain electrode 24 is greater than that of the polarization modification layer 17 under the groove G1.

Based on the above description and drawings, the present invention provides a semiconductor structure, which includes a gallium nitride (GaN) layer 12, an aluminum gallium nitride (AlGaN) layer 14 on the GaN layer 12, a polarization boost layer 16 on the aluminum gallium nitride layer 14 and in direct contact with the aluminum gallium nitride layer 14, and a gate liner layer 20 on the polarization boost layer 16.

In some embodiments of the present invention, the material of the polarization boost layer 16 includes p-type doped silicon.

In some embodiments of the present invention, the minimum thickness of the polarization boost layer 16 is less than 30 angstroms.

In some embodiments of the present invention, a groove G1 is further included in the polarization boost layer 16, and the gate liner layer 20 is partially located in the groove G1.

In some embodiments of the present invention, a thickness TK1 of the polarization boost layer 16 located directly under the groove G1 is less than a thickness TK2 of the polarization boost layer 16 located next to the groove G2.

In some embodiments of the present invention, a polarization modification layer 17 is further included in the groove G1 and between the gate liner layer 20 and the polarization boost layer 16.

In some embodiments of the present invention, the polarization modification layer 17 contains silicon, and its carbon concentration is higher than that of the polarization boost layer 16.

In some embodiments of the present invention, the gate liner layer 20 contains p-type doped gallium nitride.

In some embodiments of the present invention, a dielectric layer 18 is further included on the polarization boost layer 16, and a part of the gate liner layer 20 covers the dielectric layer 18.

In some embodiments of the present invention, the polarization boost layer 16 contains doping ions selected from boron, aluminum, gallium, indium and thallium.

The invention also provides a manufacturing method of semiconductor structure, which includes forming a gallium nitride (GaN) layer 12, forming an aluminum gallium nitride (AlGaN) layer 14 on the GaN layer 12, forming a polarization boost layer 16 on the aluminum gallium nitride layer 14 and directly contacting the aluminum gallium nitride layer 14, and forming a gate liner layer 20 on the polarization boost layer 16.

In some embodiments of the present invention, an etching step is further performed to form a groove G1 in the polarization boost layer 16, and the gate liner layer 20 is partially located in the groove G1.

In some embodiments of the present invention, after the groove G1 is formed, part of the surface of the polarization boost layer 16 exposed by the groove G1 is converted into a polarization modification layer 17 in the groove G1.

To sum up, in the present invention, by arranging the polarization boost layer on the AlGaN layer, since the polarization boost layer is p-type doped silicon, the polarity of the AlGaN layer can be improved, which further leads to the increase of the polarity of the 2DEG layer and further improves the performance of the transistor. In addition, a part of the polarization boost layer has become a polarization modification layer in the manufacturing process, which has the effects of reducing surface roughness and preventing ion diffusion.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a gallium nitride (GaN) layer;
   an aluminum gallium nitride (AlGaN) layer located on the gallium nitride layer;
   a polarization boost layer located on the aluminum gallium nitride layer and directly contacting the aluminum gallium nitride layer;
   a gate liner layer located on the polarization boost layer; and
   a groove in the polarization boost layer, and the gate liner layer is partially located in the groove.

2. The semiconductor structure according to claim 1, wherein the material of the polarization boost layer comprises p-type doped silicon.

3. The semiconductor structure according to claim 1, wherein the minimum thickness of the polarization boost layer is less than 30 angstroms.

4. The semiconductor structure according to claim 1, wherein a thickness of the polarization boost layer directly under the groove is less than a thickness of the polarization boost layer beside the groove.

5. The semiconductor structure of claim 1, further comprising a polarization modification layer located in the groove and between the gate liner layer and the polarization boost layer.

6. The semiconductor structure according to claim 5, wherein the polarization modification layer comprises silicon, and a carbon concentration in the polarization modification layer is higher than a carbon concentration in the polarization boost layer.

7. The semiconductor structure of claim 1, wherein the gate liner layer comprises p-type doped gallium nitride.

8. The semiconductor structure of claim 1, further comprising a dielectric layer on the polarization boost layer, and a part of the gate liner layer covers the dielectric layer.

9. The semiconductor structure according to claim 1, wherein the polarization boost layer contains doping ions selected from boron, aluminum, gallium, indium and thallium.

* * * * *